(12) United States Patent
Aoki

(10) Patent No.: US 6,967,983 B2
(45) Date of Patent: Nov. 22, 2005

(54) SEMICONDUCTOR LASER APPARATUS

(75) Inventor: Masahiro Aoki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 325 days.

(21) Appl. No.: 10/358,154

(22) Filed: Feb. 5, 2003

(65) Prior Publication Data
US 2003/0185256 A1 Oct. 2, 2003

(30) Foreign Application Priority Data
Mar. 28, 2002 (JP) ............................ P2002-090181

(51) Int. Cl.[7] .............................................. H01S 5/00
(52) U.S. Cl. ........................... 372/50; 372/43; 372/44; 372/45; 372/46
(58) Field of Search ............................. 372/50, 45, 96, 372/44, 46

(56) References Cited

U.S. PATENT DOCUMENTS

2002/0028390 A1 * 3/2002 Mazed ........................... 430/5
2004/0125846 A1 * 7/2004 Zediker et al. ................ 372/50

OTHER PUBLICATIONS

Koji Kudo, Kenichiro Yashiki, Tatusya Sasaki, Yoshitaka Yokoyama, Kiichi Hamamoto, Takao Morimoto, and Masayuki Yamaguchi, "1.55-μm Wavelength-Selectable Microarray DFB-LD's with Monolithically Integrated MMI Combiner, SOA, and EA-Modulator", IEEE Photonics Technology Letters, vol. 12, No. 3, Mar. 2000, pp. 242-244.
G.P. Agrawal et al., "Long-Wavelength Semiconductor Lasers, Chapter 7 -Distributed-Feedback Semiconductor Lasers" Van Nostrand Reinhold Company, N.Y., 1986, pp 287-289.
Sacher Lasertechnik Group "DFB/DBR Diode Lasers, Single Mode" http://www.sacher-laser.com/DFBinfo.php, pp. 1-2.

* cited by examiner

Primary Examiner—Minsun Oh Harvey
Assistant Examiner—Dung (Michael) T. Nguyen
(74) Attorney, Agent, or Firm—Reed Smith LLP; Stanley P. Fisher, Esq.; Juan Carlos A. Marquez, Esq.

(57) ABSTRACT

A device structure whereby an excellent tunable laser does not require a highly complicated wavelength control circuit, and delivers a high output, and excels in wavelength stability; and a structure of an optical module incorporating the laser; and a method for manufacturing the laser and the optical module. The wavelength of the laser is varied continuously with the single electric signal in the tunable wavelength range by setting the laser resonator length, the electric driving conditions of the laser at the time of tuning the wavelength, and the operating temperature to be in appropriate ranges, respectively. The device structure whereby improved laser gain, decreased electric resistance, and reduced heat resistance is attained by setting the waveguide width, particularly at part of or all parts of the laser resonator waveguide, to a wide width that allows multiple transverse modes to be sustained and setting both the width and the laser resonator length to appropriate values, respectively. By employing a self-image-formation effect resulting from the multi-mode interference effect, mode conversion loss in the laser resonator is reduced and, connection with an optical fiber is facilitated because the light intensity distribution at an emitting facet of the laser becomes a single-peaked lowest-order mode.

18 Claims, 7 Drawing Sheets

F I G. 2
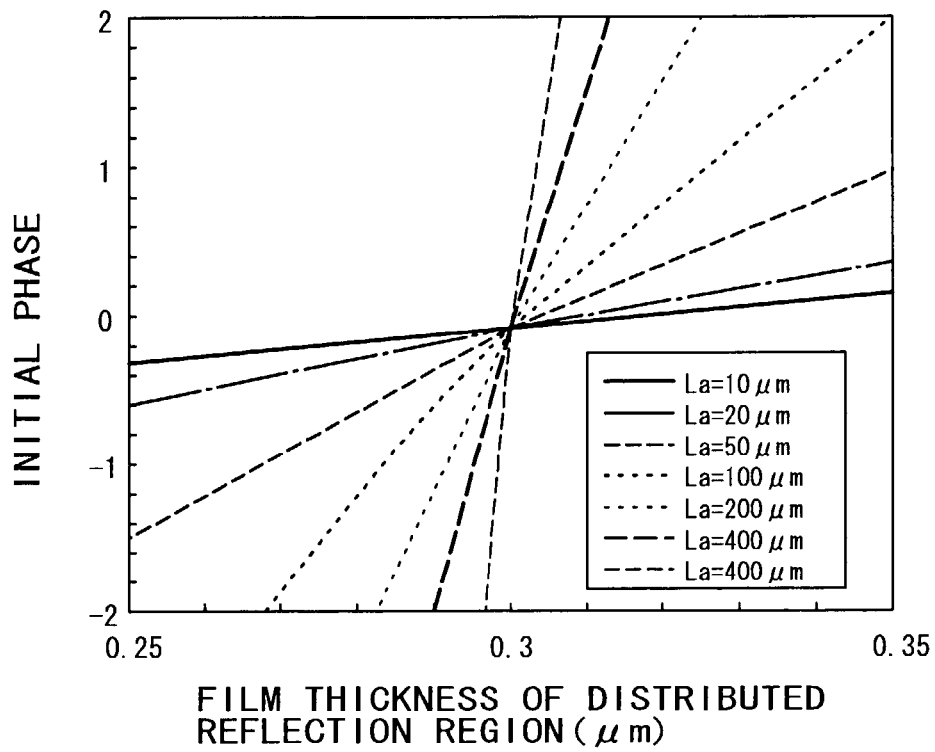
F I G. 3
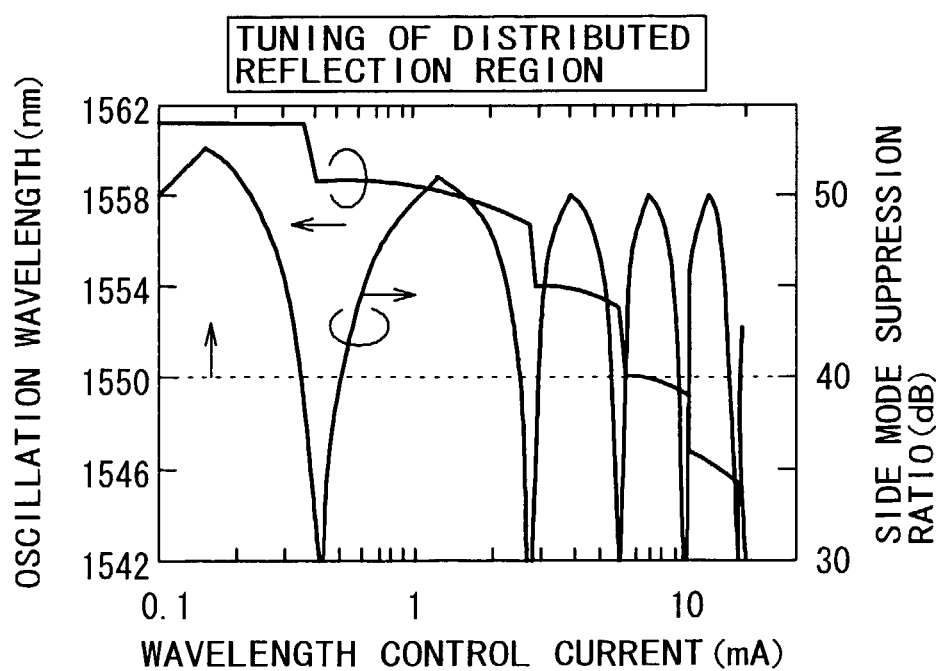

F I G. 4
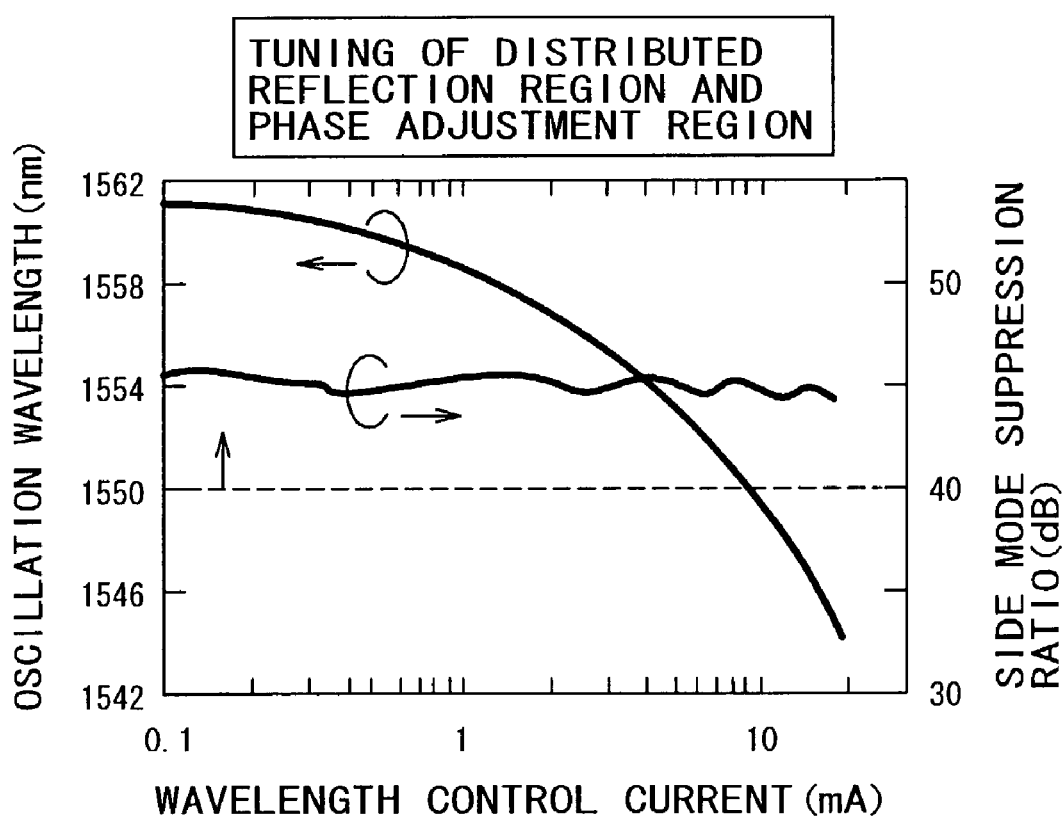

SEMICONDUCTOR LASER APPARATUS

BACKGROUND OF THE INVENTION

1. Field of the Invention

The present invention relates to a semiconductor laser, especially to a semiconductor laser for communication systems that has a short laser cavity length and is suited for a wavelength-tunable operation in a wide wavelength range, and to an optical module of the same.

2. Description of the Related Art

It is known that, in the tunable distributed reflection type semiconductor laser in which an active waveguide having a function of light amplification and a waveguide reflector that has a diffraction grating and adjusts an emission wavelength by varying a reflection wavelength range are connected monolithically in a traveling direction of light, hopping of the laser axial mode occurs as the wavelength varies. This phenomenon can be explained by that a mode hopping spacing $\Delta\lambda$ of the distributed reflection type laser without a phase adjustment region and an active region length $L_a$ are linked to each other by a relationship:

$$\Delta\lambda = \lambda^2 / 2 n_a L_a$$

and the amount of phase change equal to $2\pi$ may occur depending on the wavelength change $\Delta\lambda$. Here, $n_a$ denotes the refractive index of a laser medium, and $\lambda$ denotes an oscillation wavelength. A semiconductor laser of this type is described in Technical Digest, Paper TuB4, 17th International Semiconductor Laser Conference where $L_a$ is about 410 μm, and the longitudinal-mode hopping occurs periodically at $\Delta\lambda = 0.8$ nm as calculated from the above equation. Therefore, the oscillation wavelength is controlled to be in the vicinity of the Bragg wavelength where mode hopping is minimized by use of a complicated mode-stabilizing circuit. Further, at the same time, the oscillation wavelength is separately controlled to coincide with a desired standardization wavelength grid that is used in high-density wavelength division multiplexing communications by use of a temperature adjusting circuit. Moreover, similar improved distributed reflection type lasers each of which uses a sample diffraction grating structure, or a super-structure diffraction grating structure, or the like in the diffraction grating part require further complicated control circuits.

On the other hand, in development is a multi-wavelength distributed feedback laser-array device of an optical multiplexer integrated type in which distributed feedback lasers each having a different wavelength are arrayed in a transverse direction or in a longitudinal direction and optical outputs of the lasers are multiplexed in a single location. In this device, for distributed feedback lasers, one that is of a $\lambda/4$ phase-shift type or of a gain coupling type each of which controls fabrication difference of the mode phase is adopted, and hence basically stable single-mode operation can be obtained. However, the laser has intrinsic problems which require improvement in that laser channels must be switched over every time the emission wavelength is varied for a wavelength range of a few nm and a response speed at the time of switching the wavelength range is limited to a few msec because the wavelength needs to be fine tuned by controlling an operating temperature of the laser.

Further, although no example of realization has been achieved until now, there can easily be conceived a way of making an array of the above-mentioned distributed reflection type lasers that have wider tunable wavelength widths than the distributed feedback laser to effect expansion of the wavelength range. However, this configuration has an intrinsic problem that, since each distributed reflection type laser has a plurality of control terminals, the number of control terminals is multiplied by the number of arrayed lasers described in IEEE Photonics Technology Letters, Vol. 12, No. 3, pp. 242–244, March 2000.

In the above-mentioned conventional tunable laser, a highly complicated wavelength control circuit is indispensable.

SUMMARY OF THE INVENTION

The present invention provides a tunable laser capable of operating in a wide tunable wavelength range with a simple-structure control circuit and excels in wavelength stability, and a method for manufacturing the same. More particularly, the present invention provides a tunable laser that suppresses the longitudinal-mode hopping when being tuned and realizes a stable longitudinal-mode operation, and a method for controlling the wavelength of the tunable laser. Further, the present invention provides a tunable laser having an improved optical output through the improvement of a waveguide structure of a short-resonator laser that is effective to implement the above-mentioned operation. Moreover, the present invention provides an optical module that incorporates any of the above-mentioned optical devices and is capable of high-performance operation.

The laser of the present invention is tuned continuously with a single electric signal over its tunable wavelength range by setting the following parameters in appropriate ranges: the length of a laser resonator; electric drive conditions of the laser when being tuned; and the operating temperature. In the device of the present invention, laser gain is improved, and electric resistance and thermal resistance are decreased by setting the waveguide width, particularly at part of or all parts of a laser resonator waveguide, to a wide width that allows multi transverse modes to be sustained and setting both the width and the laser resonator length to appropriate values. In this setting, the use of the self-imaging effect resulting from a multi-mode interference effect not only reduces the mode conversion loss in the laser resonator but also shapes the optical intensity distribution at an emitting facet of the laser into a single-peaked lowest-order mode, giving a suitable structure for connection with an optical fiber etc.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 2 is a diagram for explaining the operation of a preferred embodiment of the present invention;

FIG. 3 is a diagram for explaining the effect of a preferred embodiment of the present invention;

FIG. 4 is a diagram for explaining the effect of a preferred embodiment of the present invention;

DETAILED DESCRIPTION OF THE INVENTION

Figure 1A:
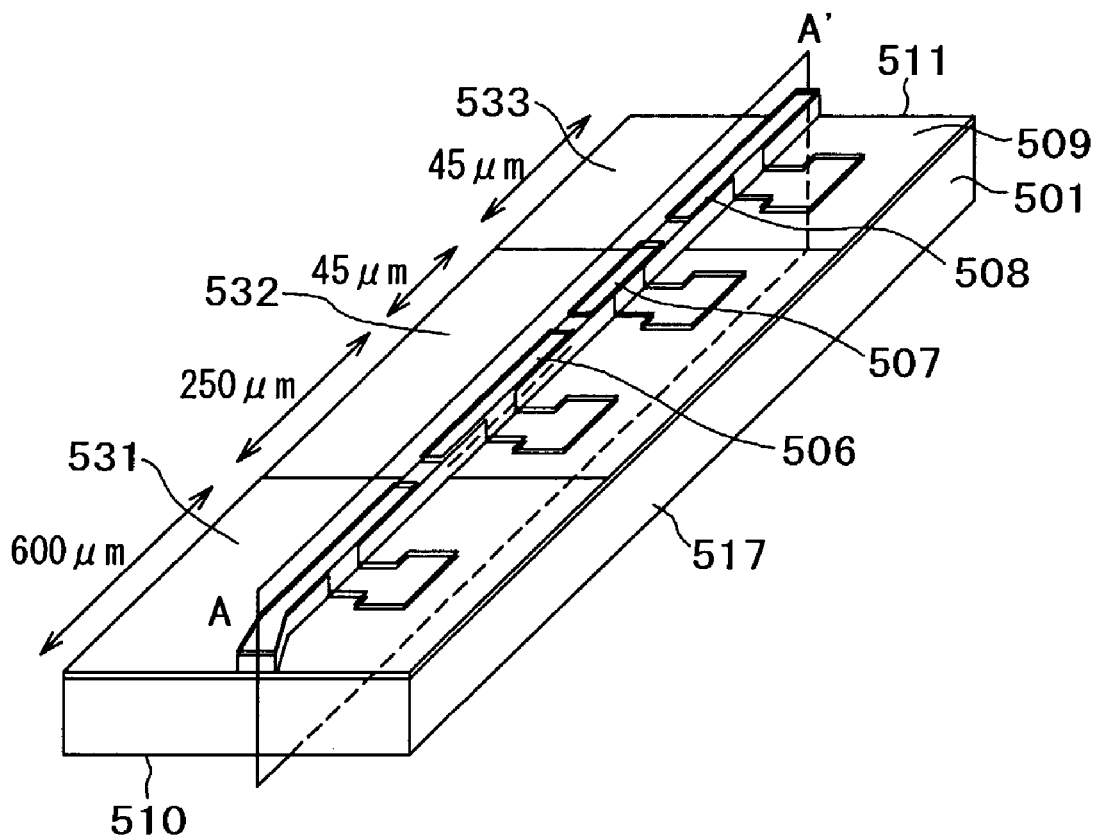
FIG. 1A is a top perspective view of a preferred embodiment of the present invention.
Figure 1B:
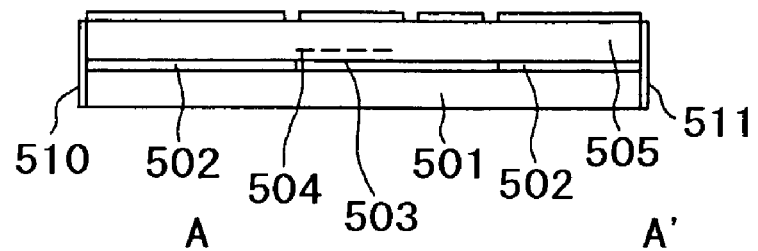
FIG. 1B is a cross-sectional view along line A–A' of FIG. 1A.

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description of the present invention and the preferred embodiment(s) thereof is set forth in detail below with reference to the attached drawings.

Hereafter, the preferred embodiments according to the present invention will be described referring to FIG. 1 through FIG. 8.

Embodiment 1

FIG. 1 is a view showing an example of fabrication of the semiconductor laser in which a 1.55 μm band distributed reflection type laser and an optical amplifier are integrated according to a first preferred embodiment of the present invention and whose oscillation wavelength can be varied with the electric signal. Continuous tunable wavelength characteristics of the distributed reflection type laser are determined by the longitudinal-mode hopping of the laser. The interval of the laser longitudinal-mode hopping $\Delta\lambda_{DBR}$ is dependent on a region length L and is given by the equation:

$$\Delta\lambda_{DBR} = \lambda^2 / 2(n_a L_a + n_p L_p) \quad (1)$$

Here, λ denotes the oscillation wavelength, n denotes the optical refractive index of the laser medium, and suffixes (a) and (p) represent an active region and a phase adjustment region, respectively. The expression has a close relation to a fact that phase variation quantity $\Delta\phi_t$ of the laser oscillation mode in the active region accompanying a wavelength variation of Δλ is given by the equation:

$$\Delta\phi_t = 2\pi(n_a L_a + n_p L_p)\Delta\lambda/\lambda^2. \quad (2)$$

With increase of Δλ, $\Delta\phi_t$ increases linearly, and when a change of 2π occurs, the above-mentioned laser longitudinal-mode hopping will occur. Therefore, in order to make larger a continuous tunable wavelength width, it is important to constrain $\Delta\phi_t$ to as small a value as possible. As is clear from the equation (2), in the case where the wavelength band λ is fixed and the refractive index of the material and the wavelength band are unchangeable, shortening of $L_a$ and $L_p$ is the only effective means to increase $\Delta\lambda_{DBR}$. A further subject in the case where the shortening of $L_a$ and $L_p$ is intended is intentional control of an initial phase $\phi_i$ of the laser oscillation mode. Generally, since the optical refractive indices of the active region and of the distributed reflection region differ from each other, both regions have different propagation constants β (i.e., $\beta_a$, $\beta_d$) to the oscillation light. For this reason, the phase change corresponding to the difference of these constants arises inevitably. The amount of this phase shift is given by the following equation:

$$f_i = (\beta_a - \beta_d)L_a - \Delta\beta L_a \phi \quad (3)$$

An actual phase φ of the laser oscillation mode is given by the equation:

$$\phi = \phi_i + \Delta f_t. \quad (4)$$

In order to perform intentional control of $\phi_i$, it is required to set the difference between the propagation constants of the active region and of the distributed reflection region to a desired value. In actual element fabrication, the active region and the distributed reflection region are grown by separate crystal growth processes; therefore the difference between the propagation constants suffers variation due to slight differences in the film thickness and in the crystal composition. FIG. 2 shows the results of the theoretical calculation of $\phi_i$, indicating variation of $\phi_i$ to crystal film thickness variation of the distributed reflection region. Note that, parameters of the semiconductor laser apparatus are set in such a way that the phase matching ($\beta_a = \beta_d$) is achieved between the active region and the distributed reflection region when the crystal film thickness of the distributed reflection region is 0.3 μm. Here, an important point is that, since $\phi_i$ is proportional to $L_a$, the shortening of $L_a$ is also very effective to improve controllability of $\phi_i$. For example, assuming that film thickness error is 0.01 μm, in the conventional case where La is a few hundreds of micrometers long, $\phi_i$ easily varies as large as a few π, and hence the phase control is completely impossible. On the other hand, for example, when $L_a$ is set to be as small as 50 μm or less, it becomes possible that $\phi_i$ is set to about ±0.3π or less. Further, it is also possible to properly adjust the operating temperature of the laser as a technique of fine-tuning $\phi_i$ after fabrication of the laser device.

In FIG. 1, on an n-type (100) InP semiconductor substrate 501, the following layers were grown successively by an organic-metal vapor-phase-epitaxy method: an n-type InGaAlAs refractive-index control layer 503 (composition wavelength of 1.40 μm) of a 0.3 μm thickness; an InAlAs etching stop layer of a 0.02 μm thickness; a p-type InP spacer layer of a 0.02 μm thickness; and an InGaAsP diffraction-grating accommodating layer 504 (composition wavelength of 1.37 μm). Next, a uniform diffraction grating with a period of 241 nm was engraved on the diffraction-grating accommodating layer 504 by a known technique. Then, by means of known preferential etching and a known technique of direct coupling between different kinds of waveguides, a multiple quantum well active layer 502 that is comprising 5 quantum wells made of strained InGaAlAs materials is grown preferentially in the vicinities of locations that will later become the active region of the distributed reflection type laser and an active region of the optical amplifier. Subsequently, a p-type InP clad layer 505 of a 1.5 μm thickness and a high-concentration p-type InGaAs cap layer of a 0.2 μm thickness are formed successively by the organic-metal vapor-phase-epitaxy method. The emission wavelength of the multiple quantum well active layer 502 is approximately 1.56 μm. An effective refractive index of the above-mentioned InGaAlAs refractive-index control layer 503 (composition wavelength of 1.40 μm) is set to a slightly smaller value in expectation of variation in the refractive index due to variation in carrier density at the multiple quantum well active layer 502 at the time of laser oscillation.

Next, by using a mask of a stripe for the insulated stripe, a ridge-waveguide is formed by known preferential dry etching. In this process, a single transverse mode waveguide in the form of a straight line of a width of 1.6 μm is formed. The lengths of a distributed reflector, the phase adjustment region, the laser active region, and the optical-amplifier active region are 250 μm, 45 μm, 45 μm, and 600 μm, respectively. Isolation regions of a 5 μm length are provided between respective regions. Total device length is 905 μm. A wafer after completion of a growth process was put into wafer processing in which the device was formed into the known ridge-waveguide laser structure. A device is cut out from the wafer to be of a device length of 905 μm, and subsequently a low-reflectance film 510 of a reflectance of 0.01% is formed on a front facet of the optical amplifier and a high-reflectance film 511 of a reflectance of 95% is formed on a rear facet of the laser active region.

The fabricated distributed reflection type laser oscillated at a single axial mode in a 1,550 nm band. Threshold current was about 5 mA. At a laser current of 30 mA and an optical amplifier current of 50 mA, the chip delivered an optical output of about 10 mW, which was sufficient for optical communication purposes. With the laser current and the optical amplifier current kept at the above-mentioned values, a current was injected into the distributed reflector to tune the oscillation wavelength. Tunable wavelength characteristics are shown in FIG. 3. The upper curve in FIG. 3 shows tuning characteristics when the current is injected into only the distributed reflector. It was observed that there occurs the longitudinal-mode hopping at a wavelength separation of approximately 3.2 nm that corresponds to a sum of the length of the laser active region and that of the phase adjustment region, i.e. 100 μm. Since a side-mode suppression ratio varies largely in connection with this longitudinal-mode hopping, a usable wavelength range in the tunable wavelength range of approximately 3.2 nm is approximately 2.5 nm in which the side-mode suppression ratio is 40 dB or more. On the other hand, FIG. 4 is tuning characteristics of a case where the current is injected into the phase adjustment region in addition to the distributed reflector and thus the longitudinal-mode hopping is eliminated. In this case, the longitudinal-mode hopping can easily be suppressed. This is because the sum of the lengths of the active region and of the phase adjustment region is decreased to 100 μm, that is, the laser apparatus is made to have a resonator structure that is less prone to the mode hopping, and this is a significant improvement for achievement of continuous tuning.

By shortening the active-region length of the distributed reflection type laser in this way and hence reducing the phase change in the oscillation mode resulting from the wavelength variation in the active region, the lasing single spectral state has been stabilized at the time of tuning the wavelength. Further, since reduction in the optical output that accompanies shortening of the active layer can easily be compensated for by the optical amplifier integrated in the laser apparatus, the integrated configuration of the distributed reflection type laser whose active layer is shortened and the optical amplifier are constituent elements of a preferred embodiment of the present invention.

Figure 5A:
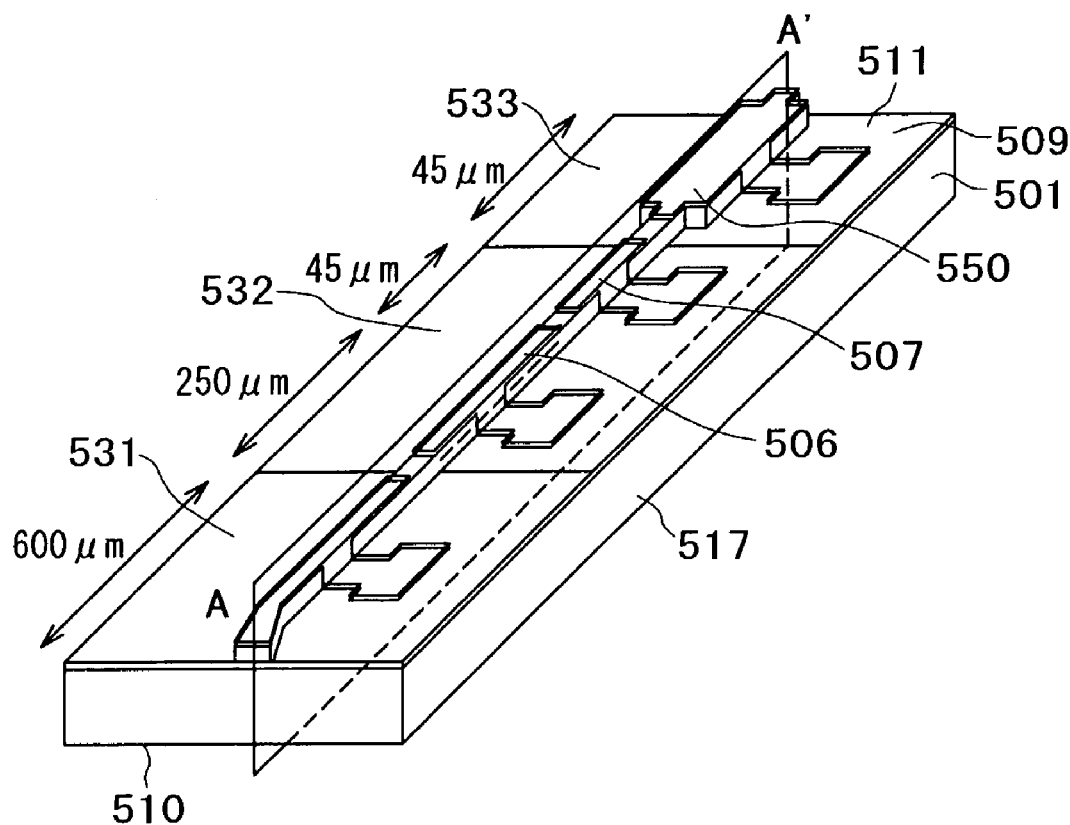
FIG. 5A is a top perspective view of another preferred embodiment of the present invention.
Figure 5B:
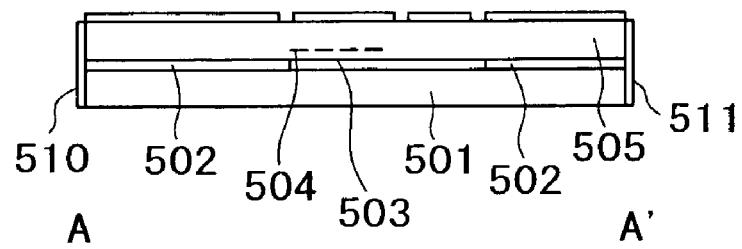
FIG. 5B is a cross-sectional view along line A–A' of FIG. 5A.

An example of the characteristic improvement according to the present invention is shown in FIGS. 5A and 5B. A multi-mode interference waveguide 550 whose width is widened at a middle part of the laser active-layer waveguide, as shown in the figure, and the width and the waveguide length of this multi-mode interference waveguide part are designed to be appropriate values, whereby highly efficient optical coupling between the single-mode waveguide and the multi-mode interference waveguide is achieved. In this preferred embodiment, the widths were set to 4.5 μm and 42.0 μm, respectively. Shortening the active-region length increases electric resistance. For example, in an element without the above-mentioned multi-mode interference waveguide, electric resistance is about 35 Ω. In this preferred embodiment, introduction of the multi mode interference waveguide decreases the electric resistance of the laser part to about 15 Ω, and therefore the output characteristics of the laser part are improved. In addition, this structure can reduce instability of the oscillation mode resulting from a phenomenon that Joule heat generated in the laser part is conducted to the distributed reflection region. Moreover, since carrier density at lasing threshold in the laser active region is reduced, it becomes easier to perform intentional control of the initial phase $\phi_i$ of the laser oscillation mode.

In the foregoing, the preferred embodiment according to the present invention was described taking as an example the ridge-waveguide type laser structure that used InGaAlAs material. The present invention is preferably applicable similarly to all semiconductor laser materials, such as InGaAsP, GaInNAs, InGaAs, and InGaAlP. Further, the present invention is not only applicable to the ridge-waveguide laser but also preferably to lasers that use the so-called embedded heterostructure or the so-called embedded ridge structure.

In the above, described was availability of the structure in which the active region of the distributed reflection laser was shortened to improve the continuous tunable wavelength characteristics. This effect can be achieved similarly by applying the present invention to similar, improved distributed refection type lasers that use a sample diffraction grating structure, or a super-structure diffraction grating structure, or the like.

Written below are the names of the function that correspond to the numbers in FIG. 1A, FIG. 1B, FIG. 5A and FIG. 5B. They are; 501: n-type InP substrate, 502: multiple quantum well layer, 503: n-type InGaAlAs refractive-index controlling layer, 504: grating layer, 505: p-type InP cladding layer, 506: DBR electrode, 507: phase control electrode, 508: active region electrode, 509: surface passivation film, 510: anti reflection film, 511: high-reflection film, 517: bottom side electrode, 531: optical amplifier region, 532: Distributed Bragg reflector region plus phase control region, 533: active region, and 550: multi-mode interference active region.

Embodiment 2

Figure 6A:
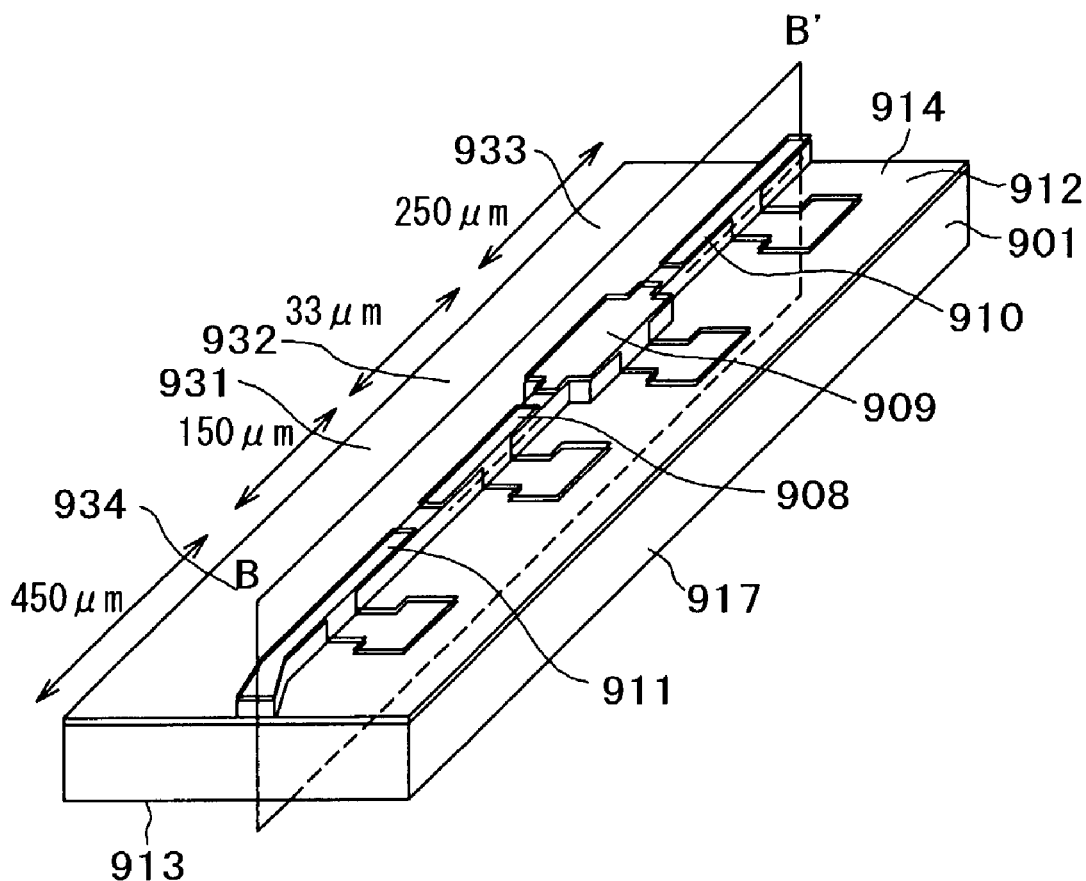
FIG. 6A is a top perspective view of yet another preferred embodiment of the present invention.
Figure 6B:
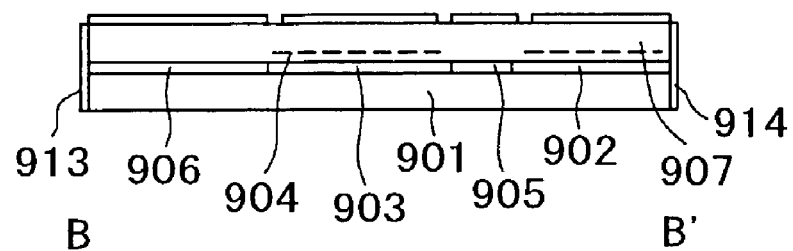
FIG. 6B is a cross-sectional view along line A–A' of FIG. 6A.

FIGS. 6A and 6B show a laser having a structure similar to that of the preferred Embodiment 1, wherein the active region length is shortened to 33 μm to effect expansion of the continuous tunable wavelength range. A basic structure and fabrication of the device are almost similar to those of Embodiment 1. The main differences in designing the laser are the following points: (1) an optical coupling coefficient of the diffraction grating was enlarged to 200 cm$^{-1}$ in order to compensate for the decrease in laser gain that accompanied the shortening of the active region, and (2) the distributed reflector is made to be such that the phases of two diffraction grating regions located in front of and in the rear of the active layer are reversed to each other, realizing the so-called λ/4 phase-shift type grating, in order to stabilize the single axial mode oscillation in the vicinity of the Bragg wavelength.

With the laser according to this preferred embodiment of the present invention, the continuous tunable wavelength width of 8 nm and an optical amplifier output of 10 mW were successfully obtained. In this preferred embodiment of the present invention, since the active region is short, the optical phase variation accompanying the wavelength variation is very small. Consequently, it is an important point of the present invention that the laser apparatus minimizes the longitudinal-mode hopping. Further, it is an essence of the present invention that by the introduction of the multi-mode interference waveguide, variation of the initial phase of the laser oscillation mode that accompanies both abrupt increases in the electric resistance and decreases in carrier density at the lasing threshold is suppressed.

Written below are the names of the function that correspond to the numbers in FIG. 6A and FIG. 6B. They are; 901: n-type InP substrate, 902: rear InGaAlAs refractive-index controlling layer, 903: front InGaAlAs refractive-index controlling layer, 904: grating, 905: multiple quantum well layer, 906: multiple quantum well layer, 907: p-type InP cladding layer, 908: front DBR electrode, 909: electrode for multi-mode interference active region, 910: rear DBR electrode, 911: optical amplifier electrode, 912: surface passivation film, 913: anti-reflection film, 914: high-reflection film, 917: bottom side electrode, 931: front distributed Bragg reflector region, 932: active region, 933: rear distributed Bragg reflector region, 934: optical amplifier region.

Embodiment 3

Figure 7:
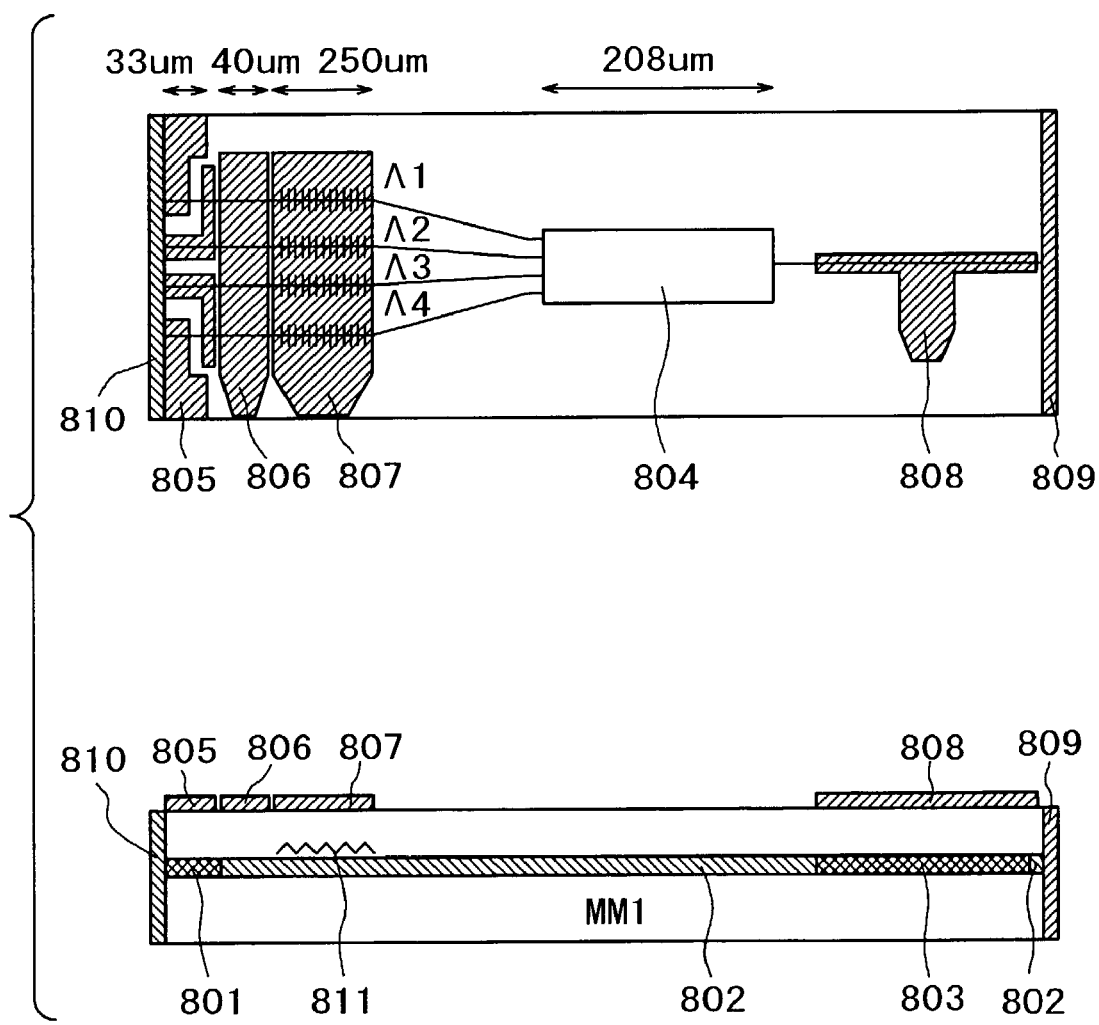
FIG. 7 is a diagram for explaining a further preferred embodiment of the present invention.
Figure 8:
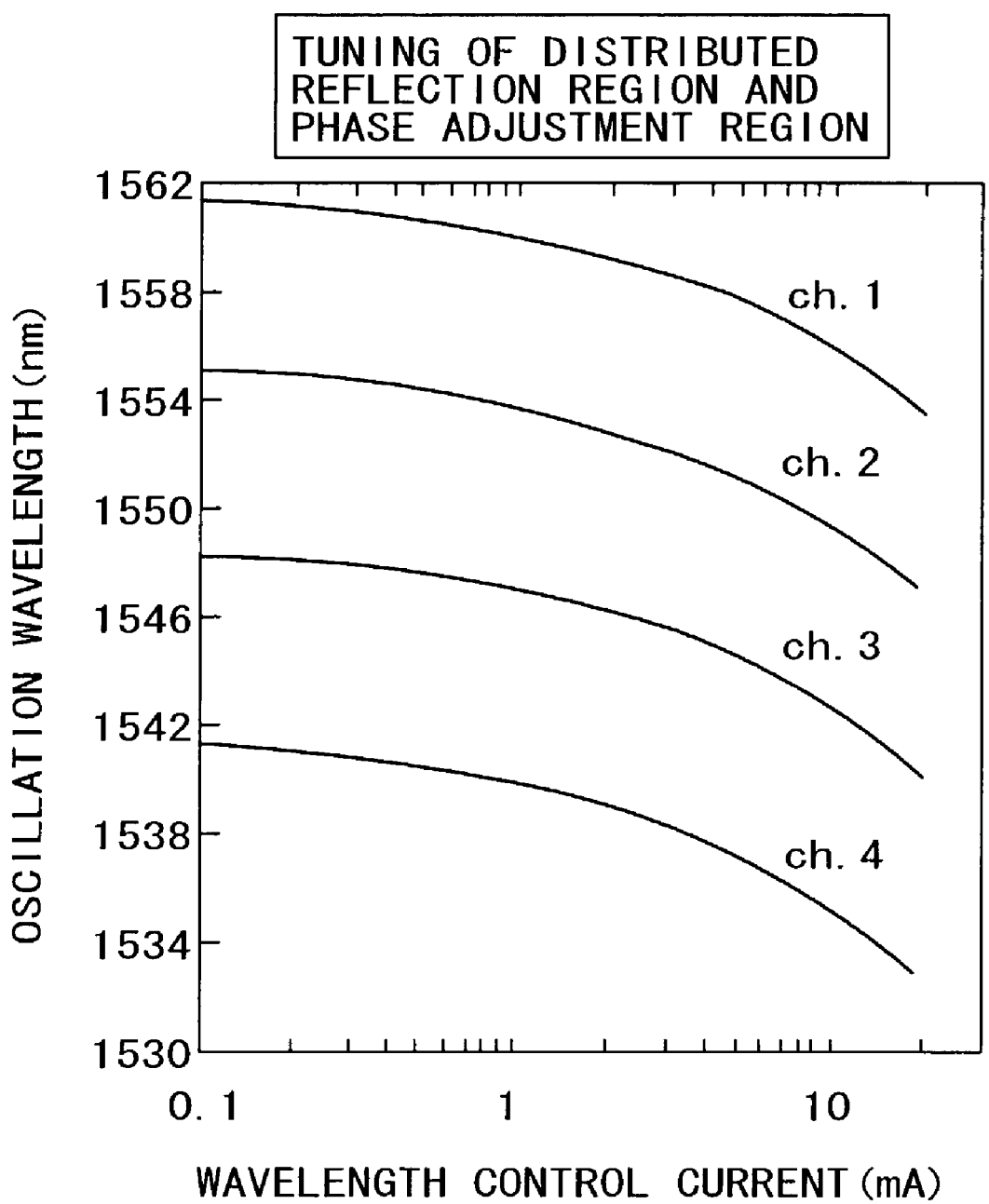
FIG. 8 is a diagram for explaining the effect of a preferred embodiment of the present invention.

FIG. 7 shows a configuration shown in Embodiment 2, wherein four distributed reflection lasers 805 each having a different wavelength range are integrated into an array in a side by side manner. Using a known 4×1 optical multiplexer 804 that uses a multi-mode interference waveguide, the outputs of the lasers are guided to an optical amplifier 803 that is monolithically integrated with an output waveguide thereof. In this preferred configuration, a different point from the configuration of the conventional distributed feedback laser array is that, as shown in the figure, wavelength controlling terminals 807 and phase controlling terminals 806 of the lasers are connected to common terminals, respectively. This configuration becomes feasible for the following reasons: (1) two or more lasers are not operated simultaneously, and (2) dead current is an order of 90 mA or less at a maximum because the wavelength controlling current and the phase controlling current are 30 mA or less, respectively. By controlling the period of the diffraction grating built in each laser, for example, by the electron beam exposure method, the initial wavelengths of the lasers (oscillation wavelengths without the tuning) were set so as to have a 7 nm spacing between adjacent lasers. Each laser is tuned for a continuous wavelength range of approximately 7 nm as shown by each curve in FIG. 8 which is similar to FIG. 2 (preferred Embodiment 2), and the four lasers are made to operate in a relay manner, whereby the wavelength-tunable operation that covers a wavelength range of 28 nm was achieved. In this case, since the same wavelength and phase controlling terminals and the same control circuits are used for all of the four lasers, not only the configuration of the laser but also the control circuit is simplified substantially.

Written below are the names of the function that correspond to the numbers in FIG. 7. They are; 801: multiple quantum well laser active layer, 802: passive waveguide layer, 803: multiple quantum well SOA active layer, 804: combiner, 805: distributed reflection lasers, 806: phase controlling terminals, 807: wavelength controlling terminals, 808: electrode for optical amplifier, 809: anti-reflection film, 810: high-reflection film, 811: grating.

According to the semiconductor light emitting devices as described by the preferred embodiments of the present invention, the tunable distributed reflection type semiconductor laser and the optical module on which that laser is mounted are simplified. If the embodiments according to the present invention are used, not only the device performance and the yield can be improved markedly, but also optical communication systems to which these devices are applied can easily be realized at a lower cost, with a larger capacity, and for a longer distance.

The foregoing invention has been described in terms of preferred embodiments. However, those skilled, in the art will recognize that many variations of such embodiments exist. Such variations are intended to be within the scope of the present invention and the appended claims.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A tunable distributed Bragg reflection type semiconductor laser apparatus comprising an active waveguide having a function of light amplification and a waveguide reflector that has a diffraction grating and adjusts an emission wavelength by varying reflection wavelength range are connected monolithically in a traveling direction of light, wherein the length of said active waveguide $L_a$, the phase of said diffraction grating $\phi_G$, the operating temperature of the laser $T_{LD}$, and the tunable wavelength range $\Delta\lambda$ are specified so that a phase of a reflected mode $\phi$ with respect to an incident mode that oscillates at a single wavelength and enters the waveguide reflector takes a value in the range greater than 0 to $\pi$, and $\phi = 2\pi N - ((4 n_a(T_{LD}))/\lambda) - 2\phi_G$, wherein $n_a$ is a refractive index of an active region and N is an integer.

2. A tunable distributed Bragg reflection type semiconductor laser apparatus according to claim 1, wherein the length of said active waveguide is 100 μm or less and said tunable wavelength range $\Delta\lambda$ is 3 nm or more.

3. A tunable distributed Bragg reflection type semiconductor laser apparatus according to claim 1, wherein the length of said active waveguide is in a range of about 18 μm to 200 μm inclusive.

4. A tunable distributed Bragg reflection type semiconductor laser apparatus according to claim 1 wherein the width of said active waveguide varies along an optical axis of the active waveguide.

5. A tunable distributed Bragg reflection type semiconductor laser apparatus according to claim 1 wherein a width of said active waveguide, perpendicular to an optical axis of the active waveguide and parallel to a substrate surface, varies along the optical axis of the active waveguide.

6. A tunable distributed Bragg reflection type semiconductor laser apparatus according to claim 5 wherein the width of said active waveguide in the vicinity of a first end of said active waveguide is narrower than a cut-off width at which only a single transverse mode is sustained.

7. A tunable distributed Bragg reflection type semiconductor laser apparatus according to claim 6 wherein said first end is adjacent to the waveguide reflector.

8. A tunable distributed Bragg reflection type semiconductor laser apparatus according to claim 6 wherein the width of a portion of the active waveguide disposed between said first end and a second end of said active waveguide is wider than the cut-off width at which only a single transverse mode is sustained.

9. A tunable distributed Bragg reflection type semiconductor laser apparatus according to claim 1 wherein:
   a length of said active waveguide along an optical axis thereof is in a range of about 18 μm to 200 μm inclusive;
   a width of said active waveguide, perpendicular to said optical axis and parallel to a substrate surface, varies along the optical axis of the active waveguide, said width in the vicinity of either a first or second end of said active waveguide is narrower than a cut-off width at which only a single transverse mode is sustained; and wherein said width of a portion of the active waveguide disposed between said first and second ends is wider than the cut-off width at which only a single transverse mode is sustained.

10. A tunable distributed Bragg reflection type semiconductor laser apparatus according to claim 9 wherein the waveguide width and the waveguide length of a multi transverse mode waveguide are determined so that conversion loss accompanying mode conversion between the guide mode of the multi transverse mode waveguide and the guide mode of a transverse single mode waveguide at a junction part of both waveguides becomes a minimum.

11. A tunable distributed Bragg reflection type semiconductor laser apparatus according to claim 10 wherein, representing the waveguide width of the multi transverse mode waveguide by W, the waveguide length by L, the effective refractive index of the laser waveguide by n, and the operating wavelength by λ, these variables are determined so as to satisfy an inequality expression, $0.9nW^2/\lambda \leq L \leq 1.1nW^2/\lambda$.

12. A tunable distributed Bragg reflection type semiconductor laser apparatus according to claim 1 further comprising an optical module having an optical fiber for guiding light to the outside of said optical module.

13. A tunable distributed Bragg reflection type semiconductor laser apparatus comprising an active waveguide having amplification action and a waveguide reflector having a diffraction grating and adjusts an oscillation wavelength by changing a reflection wavelength range are connected monolithically in a traveling direction of light, wherein a product value $n_a L_a$ of the length of said active waveguide $L_a$ and its refractive index $n_a$ is determined so that a phase variation quantity $\Delta\phi$ of a laser oscillation mode in the active region accompanying the wavelength variation of $\Delta\lambda$ that is determined by $\Delta\phi = 2\pi n_a L_a \Delta\lambda/\lambda^2$, where λ is the center wavelength, falls in a range of greater than 0 to π and greater than 0 for a desired tunable wavelength range $\Delta\lambda$.

14. A tunable distributed Bragg reflection type semiconductor laser apparatus according to claim 13 wherein the length $L_a$ of said active waveguide is 100 μm or less and the tunable wavelength range $\Delta\lambda$ is 3 nm or more.

15. A tunable distributed Bragg reflection type semiconductor laser apparatus according to claim 13 wherein:
   a length of said active waveguide along an optical axis thereof is in a range of about 18 μm to 200 μm inclusive;
   a width of said active waveguide, perpendicular to said optical axis and parallel to a substrate surface, varies along the optical axis of the active waveguide, said width either in the vicinities of both first and second ends of said active waveguide or in the vicinity of the first end adjacent to the waveguide reflector is narrower than a cut-off width at which only a single transverse mode is sustained; and
   wherein said width of a portion of the active waveguide disposed between said first and second ends is wider than the cut-off width at which only a single transverse mode is sustained.

16. A tunable distributed Bragg reflection type semiconductor laser apparatus according to claim 15 wherein the waveguide width and the waveguide length of a multi transverse mode waveguide are determined so that conversion loss accompanying mode conversion between the guide mode of the multi transverse mode waveguide and the guide mode of a transverse single mode waveguide at a junction part of both waveguides becomes a minimum.

17. A tunable distributed Bragg reflection type semiconductor laser apparatus according to claim 16 wherein the waveguide width W and the waveguide length L of the multi transverse mode waveguide, an effective refractive index n, and the operating wavelength λ are set so as to satisfy $0.9nW^2/\lambda \leq L \leq 1.1nW^2/\lambda$.

18. A tunable distributed Bragg reflection type semiconductor laser apparatus according to claim 13 further comprising an optical module having an optical fiber for guiding light to the outside of said optical module.

* * * * *